US012757577B2

(12) United States Patent
Lee et al.

(10) Patent No.: US 12,757,577 B2
(45) Date of Patent: Oct. 6, 2026

(54) DISPLAY DEVICE AND ELECTRONIC DEVICE INCLUDING THE SAME INCLUDING SIGNAL TRANSMISSION REGION

(71) Applicant: Samsung Display Co., Ltd., Yongin-si (KR)

(72) Inventors: Jawoon Lee, Seoul (KR); Wooseung Kang, Seoul (KR); Jae Kyung Go, Yongin-si (KR); Youngmin Kim, Seoul (KR); Yongseung Park, Yangpyeong-gun (KR); Minjun Jo, Cheonan-si (KR); Young Seo Choi, Yongin-si (KR); Haeri Choi, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 757 days.

(21) Appl. No.: 17/989,220

(22) Filed: Nov. 17, 2022

(65) Prior Publication Data

US 2023/0165063 A1 May 25, 2023

(30) Foreign Application Priority Data

Nov. 22, 2021 (KR) ........................ 10-2021-0161021

(51) Int. Cl.
*H10K 59/122* (2023.01)
*H10K 59/131* (2023.01)
*H10K 59/40* (2023.01)

(52) U.S. Cl.
CPC ......... *H10K 59/122* (2023.02); *H10K 59/131* (2023.02); *H10K 59/40* (2023.02)

(58) Field of Classification Search
CPC .... H10K 50/85; H10K 50/841; H10K 59/122; H10K 59/131; H10K 59/40;
(Continued)

(56) References Cited

U.S. PATENT DOCUMENTS

| | | | |
|---|---|---|---|
| 10,304,913 | B2 | 5/2019 | Choi et al. |
| 10,529,952 | B2 | 1/2020 | Kim et al. |

(Continued)

FOREIGN PATENT DOCUMENTS

| | | | | | |
|---|---|---|---|---|---|
| CN | 112713247 | A * | 4/2021 | ............ | H10K 59/12 |
| KR | 1020190098703 | A | 8/2019 | | |

(Continued)

*Primary Examiner* — Ida M Soward

(74) *Attorney, Agent, or Firm* — CANTOR COLBURN LLP

(57) ABSTRACT

A display device in which a signal transmission region, a peripheral region surrounding at least a portion of the signal transmission region, and a display region adjacent to the peripheral region are defined includes a base layer, a circuit layer disposed on the base layer, and a light-emitting element layer disposed on the circuit layer. The light-emitting element layer includes a plurality of light-emitting elements disposed in the display region, and a pixel defining film in which a plurality of light-emitting openings in which the plurality of light-emitting elements is disposed respectively is defined. A hole penetrating each of the circuit layer and the light-emitting element layer is defined in the signal transmission region, a portion of the pixel defining film is disposed in the peripheral region, and a first opening defined in the peripheral region is defined in the portion, disposed in the peripheral region, of the pixel defining film.

18 Claims, 10 Drawing Sheets

(58) Field of Classification Search
CPC .... H10K 59/873; H10K 59/121; H10K 59/65; H10K 59/124
See application file for complete search history.

(56) References Cited

U.S. PATENT DOCUMENTS

| | | | | |
|---|---|---|---|---|
| 10,564,756 | B2 | 2/2020 | Lee et al. | |
| 10,727,450 | B2 | 7/2020 | Yun et al. | |
| 10,840,317 | B2 | 11/2020 | Oh et al. | |
| 10,991,774 | B2 | 4/2021 | Sung et al. | |
| 11,004,914 | B2 | 5/2021 | Jo et al. | |
| 12,051,682 | B2 * | 7/2024 | Bok | H01L 25/18 |
| 2015/0091030 | A1 * | 4/2015 | Lee | H10K 59/122 438/34 |
| 2018/0013092 | A1 | 1/2018 | Park | |
| 2020/0143722 | A1 * | 5/2020 | Lee | G09G 3/006 |
| 2020/0161582 | A1 * | 5/2020 | Choi | H10K 59/121 |
| 2020/0176539 | A1 * | 6/2020 | Sung | H10K 59/131 |
| 2020/0176709 | A1 * | 6/2020 | Moon | G06F 3/0443 |
| 2020/0235180 | A1 * | 7/2020 | Park | H10K 59/124 |
| 2020/0287157 | A1 * | 9/2020 | Seong | H10K 59/873 |
| 2020/0287164 | A1 * | 9/2020 | Choi | H10K 59/87 |
| 2020/0295112 | A1 * | 9/2020 | Kim | H10K 71/00 |
| 2020/0303478 | A1 * | 9/2020 | Lee | H10K 59/1213 |
| 2020/0303677 | A1 * | 9/2020 | Lee | H10K 77/10 |
| 2020/0312925 | A1 * | 10/2020 | Xia | H01L 25/0753 |
| 2020/0312933 | A1 * | 10/2020 | Lee | H10K 59/8731 |
| 2020/0313101 | A1 * | 10/2020 | Jung | H10K 77/10 |
| 2020/0365672 | A1 * | 11/2020 | Choi | H10K 59/124 |
| 2020/0388788 | A1 * | 12/2020 | Long | H10K 59/122 |
| 2020/0403040 | A1 * | 12/2020 | Park | H10K 59/8791 |
| 2020/0403050 | A1 * | 12/2020 | Seon | H10K 59/122 |
| 2020/0403180 | A1 | 12/2020 | Seon et al. | |
| 2021/0066642 | A1 * | 3/2021 | Lee | H10K 59/122 |
| 2021/0111231 | A1 * | 4/2021 | Choi | H10K 59/873 |
| 2021/0126060 | A1 * | 4/2021 | Koo | H10K 50/15 |
| 2021/0134911 | A1 | 5/2021 | Park et al. | |
| 2021/0210725 | A1 * | 7/2021 | Choi | H10K 59/122 |
| 2021/0234122 | A1 * | 7/2021 | Choi | H10K 77/10 |
| 2021/0288118 | A1 | 9/2021 | Lee et al. | |
| 2021/0336214 | A1 * | 10/2021 | Bang | H10K 50/15 |
| 2021/0343810 | A1 * | 11/2021 | You | H10K 71/221 |
| 2021/0408472 | A1 * | 12/2021 | Zhang | H10K 59/8731 |
| 2022/0020957 | A1 * | 1/2022 | Choi | H10K 59/124 |
| 2022/0069255 | A1 * | 3/2022 | You | H10K 59/80517 |
| 2022/0077243 | A1 * | 3/2022 | You | H10K 59/8731 |
| 2022/0085121 | A1 | 3/2022 | Kim et al. | |

FOREIGN PATENT DOCUMENTS

| | | | | |
|---|---|---|---|---|
| KR | 20200102580 | A | 9/2020 | |
| KR | 1020200145954 | A | 12/2020 | |
| KR | 20210027715 | A | 3/2021 | |
| KR | 20210131507 | A | 11/2021 | |
| KR | 1020220034949 | A | 3/2022 | |
| WO | WO-2020080613 | A1 * | 4/2020 | H10K 59/8731 |

* cited by examiner

DISPLAY DEVICE AND ELECTRONIC DEVICE INCLUDING THE SAME INCLUDING SIGNAL TRANSMISSION REGION

This application claims priority to Korean Patent Application No. 10-2021-0161021, filed on Nov. 22, 2021, and all the benefits accruing therefrom under 35 U.S.C. § 119, the content of which in its entirety is herein incorporated by reference.

BACKGROUND

1. Field

Embodiments of the invention herein relate to a display device and an electronic device including the same, and more particularly, to a display device including a signal transmission region through which a light signal moves, and an electronic device including the display device.

2. Description of the Related Art

Recently, a portable electronic device is being widely used and a function thereof becomes increasingly more diverse. A user prefers an electronic device having a display region with a larger area and a non-display region with a smaller area.

An electronic device may include various electronic components such as a display panel that displays an image, an input sensor that detects an external input, and an electronic module. The electronic components may be electrically connected to each other via signal lines. The electronic module may include a camera, an infrared detection sensor, a proximity sensor or the like. The electronic module may be disposed below the display panel and the input sensor.

SUMMARY

A display panel and an input sensor may each define a hole for exposing such an electronic module, and the hole may be filled with resin for adjusting transmittance. However, the resin filled in the hole may flow into a pixel of a display part to cause a pixel defect.

Embodiments of the invention provide a display device which includes an electronic module having an improved function and prevents a pixel defect, and an electronic device including the display device.

An embodiment of the invention provides a display device in which a signal transmission region, a peripheral region surrounding at least a portion of the signal transmission region, and a display region adjacent to the peripheral region are defined. The display device in an embodiment includes a base layer, a circuit layer disposed on the base layer, and a light-emitting element layer disposed on the circuit layer. The light-emitting element layer includes a plurality of light-emitting elements disposed in the display region, and a pixel defining film in which a plurality of light-emitting openings in which the plurality of light-emitting elements is disposed respectively is defined. A hole that penetrates at least a portion of each of the circuit layer and the light-emitting element layer is defined in the signal transmission region, a portion of the pixel defining film is disposed in the peripheral region, and a first opening defined in the peripheral region is defined in the portion, disposed in the peripheral region, of the pixel defining film.

In an embodiment, the light-emitting element layer may further include a spacer disposed on the pixel defining film. The spacer may include a first spacer disposed between the signal transmission region and an opening region in which the first opening is defined there.

In an embodiment, the display region may include light-emitting regions in which the plurality of light-emitting elements is disposed respectively, and non-light-emitting regions adjacent to the light-emitting regions. The spacer may include a second spacer disposed in each of the non-light-emitting regions.

In an embodiment, the peripheral region may include an intermediate region that is a region between the opening region and the display region, and the spacer may not be disposed in the intermediate region.

In an embodiment, with respect to a predetermined direction extending, from a center of the hole to the display region, a width of the intermediate region in the predetermined direction may be about 30 micrometers to about 50 micrometers.

In an embodiment, the first spacer may have a closed curve shape surrounding the hole in a plan view.

In an embodiment, the circuit layer may include a plurality of insulation layers, and the pixel defining film may be disposed directly on an outermost insulation layer among the plurality of insulation layers.

In an embodiment, a surface of the outermost insulating layer on which the pixel defining film is disposed may be exposed by the first opening.

In an embodiment, the display device in an embodiment of the invention may further include a dam surrounding the hole and disposed on the base layer. The dam may include a first dam in which the plurality of insulation layers, the pixel defining film and the first spacer are stacked.

In an embodiment, the first dam may have a closed curve shape surrounding the hole in a plan view, and the dam may further include a second dam closer to a center of the hole than the first dam is.

In an embodiment, the second dam may have a smaller height than a height of the first dam.

In an embodiment, the display device in an embodiment of the invention may further include alight compensation layer overlapping at least the signal transmission region and including a portion disposed on the pixel defining film.

In an embodiment, each of the plurality of light-emitting elements may include a first electrode exposed by a light-emitting opening of the plurality of light-emitting openings, a light-emitting layer disposed on the first electrode, and a second electrode disposed on the light-emitting layer.

In an embodiment, with respect to a predetermined direction extending from a center of the hole to the display region, a width of the first opening in the predetermined direction may be about 20 micrometers to about 50 micrometers.

In an embodiment, the first opening may have a closed curve shape surrounding the hole in a plan view.

In an embodiment, the display device in an embodiment of the invention may further include an encapsulation substrate disposed on the light-emitting element layer.

An embodiment of the invention provides a display device in which a signal transmission region, a peripheral region surrounding at least a portion of the signal transmission region, and a display region adjacent to the peripheral region are defined. The display device in an embodiment of the invention includes a plurality of light-emitting elements disposed in the display region, a pixel defining film in which a plurality of light-emitting openings in which the plurality of light-emitting elements is disposed respectively, and a dam surrounding the signal transmission region and disposed in the peripheral region. A hole is defined in the signal transmission region, a portion of the pixel defining film is disposed in the peripheral region, and a first opening defined in the peripheral region and adjacent to the dam is defined in the portion, disposed in the peripheral region, of the pixel defining film.

In an embodiment, the dam may include a spacer disposed on the pixel defining film, the peripheral region may include an intermediate region that is a region between the display region and an opening region in which the first opening is defined, and the spacer may not be disposed in the intermediate region.

A embodiment of the invention provides an electronic device including a display device in which a signal transmission region, a peripheral region surrounding at least a portion of the signal transmission region, and a display region adjacent to the peripheral region; and an electronic module overlapping the signal transmission region are defined. The display device includes a base layer, a circuit layer disposed on the base layer, and a light-emitting element layer disposed on the circuit layer. The light-emitting element layer includes a plurality of light-emitting elements disposed in the display region, and a pixel defining film in which a plurality of light-emitting openings in which the plurality of light-emitting elements is disposed respectively is defined. A hole that penetrates at least a portion of each of the circuit layer and the light-emitting element layer is defined in the signal transmission region, a portion of the pixel defining film is disposed in the peripheral region, and a first opening defined in the peripheral region is defined in the portion, disposed in the peripheral region, of the pixel defining film.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
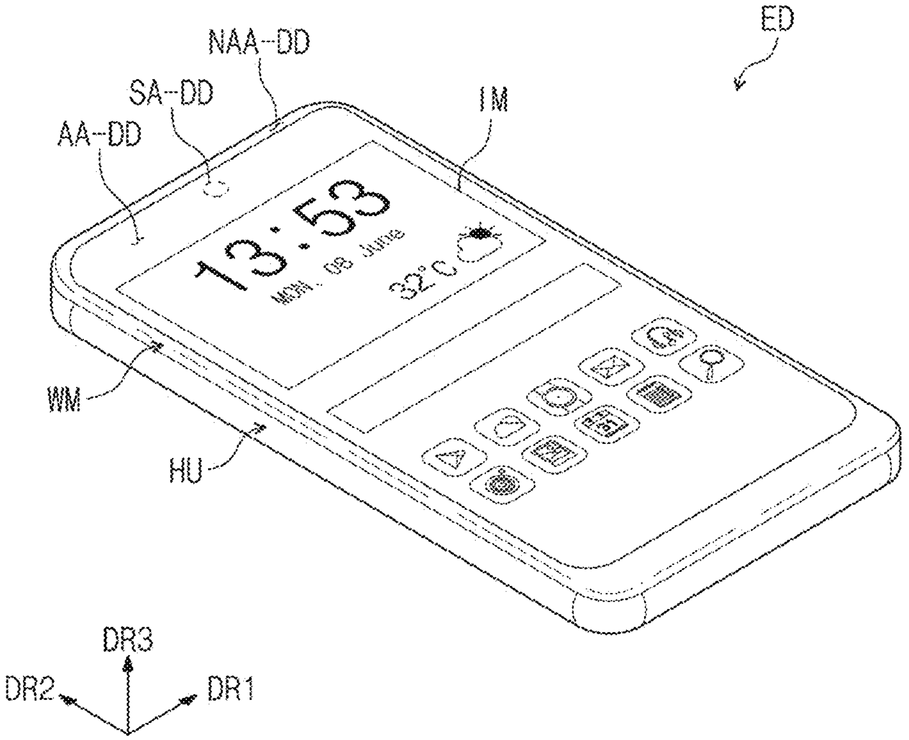
FIG. 1 is a perspective view of an embodiment of an electronic device according to the invention.

Hereinafter, embodiments of the invention will be described with reference to the accompanying drawings.

It will be understood that when an element (or region, layer, section, etc.) is referred to as being "on", "connected to" or "coupled to" another element, it can be disposed directly on, connected or coupled to the other element or a third intervening element may be disposed between the elements.

Like reference numbers or symbols refer to like elements throughout. In addition, in the drawings, the thickness, the ratio, and the dimension of elements are exaggerated for effective description of the technical contents. The term "and/or" includes one or more combinations which may be defined by relevant elements.

It will be understood that, although the terms first, second, etc. may be used herein to describe various elements, these elements should not be limited by these terms. These terms are only used to distinguish one element from another element. A first element could be termed a second element without departing from the teachings of the invention, and similarly, a second element could be termed a first element, for example. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concept and are explained based on the direction shown in the drawing.

It will be further understood that the terms such as "includes" or "has", when used herein, specify the presence of stated features, numerals, steps, operations, elements, parts, or the combination thereof, but do not preclude the presence or addition of one or more other features, numerals, steps, operations, elements, parts, or the combination thereof.

In the disclosure, the phrase "being disposed directly on" may mean that there is no additional layer, film, region, substrate or the like between a part such as a layer, film, region or substrate, and another part. The phrase "being disposed directly on," for example, may mean that two layers or two members are disposed with no additional member such as an adhesive member, used therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display panel in an embodiment of the invention and a manufacturing method thereof will be described with reference to the accompanying drawings.

Figure 2:
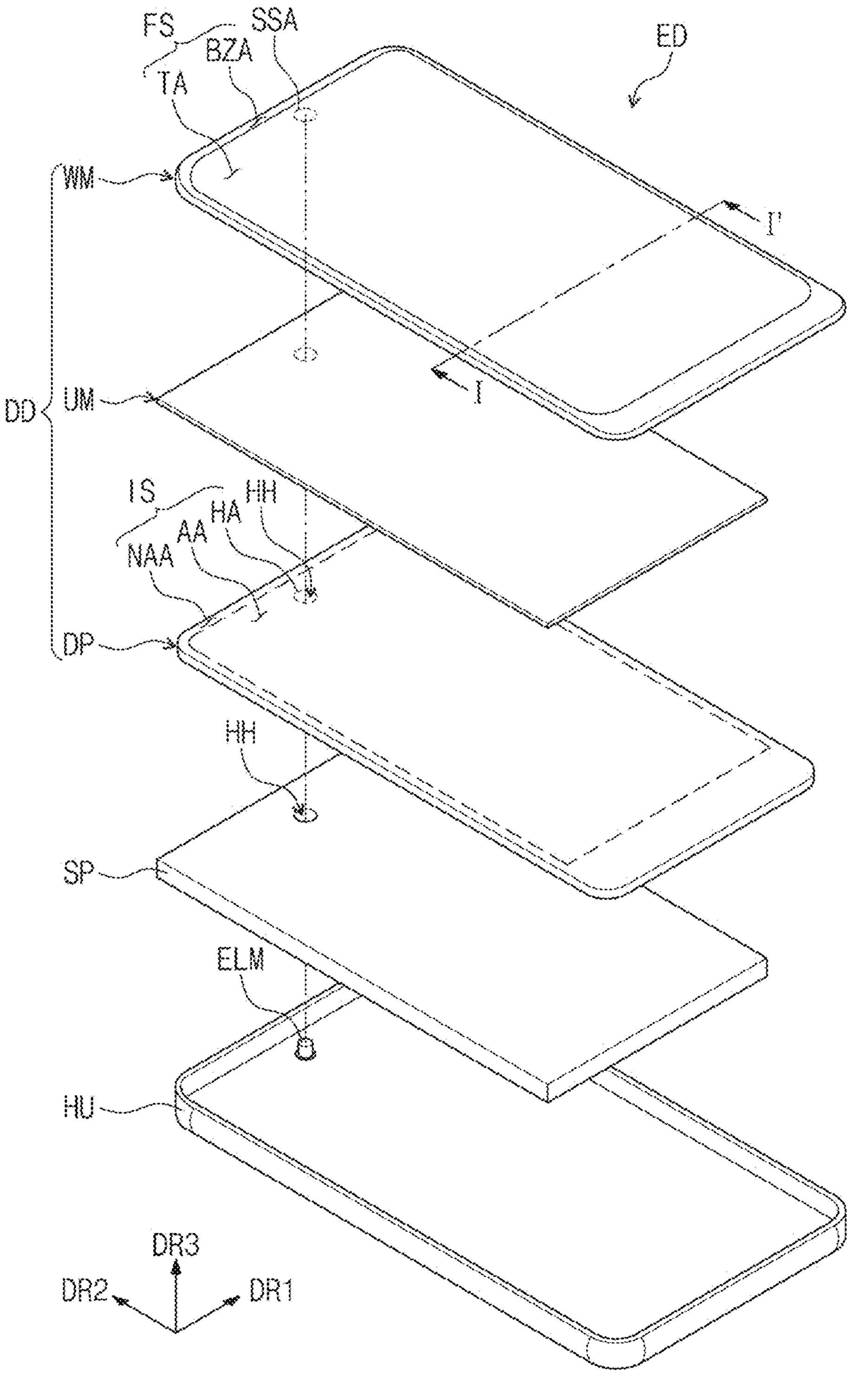
FIG. 2 is an exploded perspective view of an embodiment of an electronic device according to the invention.

FIG. 1 is a perspective view of an embodiment of an electronic device according to the invention. FIG. 2 is an exploded perspective view of an electronic device according to the invention.

An electronic device ED in an embodiment may be a device activated in response to an electrical signal. For examples, the electronic device ED may be a mobile phone, a tablet computer, a vehicle navigation device, a game console or a wearable device, but the invention is not limited thereto. FIG. 1 illustrates a mobile phone in an embodiment of the electronic device ED.

The electronic device ED in an embodiment may include an active region AA-DD and a peripheral region NAA-DD. The active region AA-DD of the electronic device ED may display an image IM. FIG. 1 illustrates a clock and a plurality of icons in an embodiment of the image IM. In the electronic device ED in an embodiment, the active region AA-DD may correspond to a display region AA of a display panel DP (refer to FIG. 2) to be described later, and the peripheral region NAA-DD may correspond to a non-display region NAA of the display panel DP. In an alternative embodiment, in an embodiment, the active region AA-DD and the peripheral region NAA-DD of the electronic device ED may respectively correspond to a transmission region TA (refer to FIG. 2) and a bezel region BZA (refer to FIG. 2) of a window WM.

The electronic device ED may display the image IM in a third direction DR3 on a display surface parallel to a plane defined by a first direction DR1 and a second direction DR2. The display surface on which the image IM is displayed may correspond to a front surface of the electronic device ED, and may correspond to a front surface FS of the window WM. In addition, the electronic device ED may have a three-dimensional shape having a predetermined thickness in the third direction DR3 perpendicular to a plane defined by the first direction DR1 and the second direction DR2.

In the disclosure, an upper surface (or front surface) and a lower surface (or rear surface) of each member are defined on the basis of a direction in which the image IM is displayed. The upper surface and the lower surface may be opposed to each other on the basis of the third direction DR3, and a normal direction of each of the upper surface and the lower surface may be parallel to the third direction DR3. Directions indicated by the first to third directions DR1, DR2 and DR3 are relative concepts and may be changed to other directions.

The active region AA-DD may have a quadrilateral shape parallel to a plane defined by the first direction DR1 and the second direction DR2. However, this is illustrated as one of embodiments. In other embodiments, the active region AA-DD may have various shapes, and is not limited to any particular embodiment.

The peripheral region NAA-DD is a region that blocks light, and may be a region disposed outside the active region AA-DD and surrounding the active region AA-DD. In an embodiment, the peripheral region NAA-DD may be disposed on side surfaces of the electronic device ED, not on the front surface thereof. In an alternative embodiment, the peripheral region NAA-DD may be omitted.

A sensing region SA-DD may be defined in the active region AA-DD of the electronic device ED. FIG. 1 illustrates a single sensing region SA-DD, but the number of the sensing region SA-DD is not limited thereto.

An electronic module ELM may be disposed in a region overlapping the sensing region SA-DD. The electronic module ELM may receive an external input delivered through the sensing region SA-DD, or may provide an output through the sensing region SA-DD.

In an embodiment, the electronic device ED may be flexible. The term "flexible" refers to a characteristic of being capable of bending, and may include all from a fully folded structure to a structure capable of bending at the level of several nanometers. In an embodiment, the electronic device ED may be a curved display device or a foldable display device, for example. In addition, the electronic device ED may be rigid.

The electronic device ED in an embodiment includes a display device DD and an electronic module ELM. The display device DD may include a display panel DP disposed on the electronic module ELM, and an upper member UM disposed on the display panel DP. The display device DD in an embodiment may include a window WM disposed on the display panel DP. In addition, the electronic device ED in an embodiment may include a support member SP and a housing HU that are disposed below the display panel DP. In the electronic device ED in an embodiment illustrated in FIGS. 1 and 2, the window WM and the housing HU may be coupled to constitute an exterior of the electronic device ED. In an embodiment, a hole HH may be defined in each of the support member SP and the display panel DP to overlap the electronic module ELM.

In the electronic device ED in an embodiment, the window WM may be disposed on the upper member UM. The window WM may include a base substrate WM-BS and a bezel pattern WM-BZ.

The base substrate WM-BS may be a substrate including an optically transparent insulation material. The base substrate WM-BS may have ductility. In an embodiment, the base substrate WM-BS may include a polymer film, a substrate including a polymer material, or a thin-film glass substrate, for example. Functional layers such as an anti-reflective layer, an anti-fingerprint layer, and a phase controlling optical layer may be further disposed on the base substrate WM-BS.

The bezel pattern WM-BZ may be a color layer printed on one surface of the base substrate WM-BS, or a color layer deposited on the base substrate WM-BS. In an embodiment, the bezel pattern WM-BZ may have a multilayer structure, for example. The multilayer structure may include a colored color layer and/or a black light-shielding layer. The colored color layer and the black light-shielding layer may be formed or provided through a depositing, printing or coating process. In an alternative embodiment, the bezel pattern WM-BZ may be omitted, or may be formed or disposed on other functional layers, not on the base substrate WM-BS.

The window WM include a front surface FS exposed to the outside. In the front surface FS of the window WM, a transmission region TA may be an optically transparent region. The transmission region TA may have a shape corresponding to a display region AA of the display panel DP. In an embodiment, the transmission region TA overlaps an entire surface or at least a portion of the display region AA, for example. An image displayed in the display region AA of the display panel DP may be visible from the outside through the transmission region TA.

A bezel region BZA of the window WM may be adjacent to the transmission region TA and surround the transmission region TA. The bezel region BZA may cover the non-display region NAA of the display panel DP to block the non-display region NAA from being visible from the outside. A sensing region SSA may be defined in the transmission region TA of the window WM. The sensing region SSA of the window WM may be defined as a sensing region SA-DD of the electronic device ED.

The electronic device ED in an embodiment may include at least one adhesive layer. The at least one adhesive layer may be disposed between the window WM and the upper member UM, and/or between the upper member UM and the display panel DP. Some of the at least one adhesive layer may be an optically clear adhesive layer. In an alternative embodiment, some of the at least one adhesive layer may be omitted.

In the electronic device ED in an embodiment, the electronic module ELM may be an electronic component that outputs or receives a light signal. In an embodiment, the electronic module ELM may be a camera module that captures an external image, for example. In addition, the electronic module ELM may be a sensor module such as a proximity sensor or an infrared emission sensor.

In the electronic device ED in an embodiment, the display panel DP may be disposed on the electronic module ELM. The display panel DP may include a display region AA and a non-display region NAA neighboring the display region AA. That is, a front surface IS of the display panel DP may include the display region AA and the non-display region NAA. The display region AA may be a region activated in response to an electrical signal.

The non-display region NAA may be adjacent to the display region AA. The non-display region NAA may surround the display region AA. In the non-display region NAA, a driving circuit or driving wiring for driving the display region AA, various signal lines or pads that provide the display region AA with an electrical signal, an electronic element, or the like may be disposed.

In the display panel DP in an embodiment, a hole region HA may be defined in the display region AA. A hole HH that penetrates a circuit layer DP-CL (refer to FIG. 6B) and a light-emitting element layer DP-OLED (refer to FIG. 6B) of the display panel DP may be defined in the hole region HA. The hole region HA may correspond to the sensing region SA-DD of the electronic device ED. The hole HH defined in each of the circuit layer DP-CL (refer to FIG. 6B) and the light-emitting element layer DP-OLED (refer to FIG. 6B) may overlap the electronic module ELM.

In the electronic device ED in an embodiment, an upper member UM may be disposed on the display panel DP. The upper member UM may be disposed between the display panel DP and the window WM. According to a configuration of the upper member UM, the display device DD may also detect an external input and/or an external pressure. The upper member UM may include various members.

In this embodiment, the upper member UM may include an optical film and an input detection sensor. The optical film may perform an anti-reflection function of reducing the reflectivity of external light. The input detection sensor may detect a user's external input. The upper member UM may further include an adhesive layer that bonds the optical film and the input detection sensor.

The optical film may include a polarizer and a phase retarder. The polarizer and the phase retarder may have a drawn or coated type. The input detection sensor may detect an external input by a capacitance method, a pressure detection method, or an electromagnetic induction method. In an alternative embodiment, the optical film may be a polarizing plate or a color filter layer including a plurality of filter parts.

The support member SP disposed below the display panel DP may include a cushion layer, a metal support layer, etc. A hole HH may be defined in the support member SP. The hole HH may be defined to correspond to the hole region HA of the display panel DP. The hole HH may correspond to the sensing region SA-DD of the electronic device ED.

The electronic module ELM may overlap the hole HH. At least a portion of the electronic module ELM may be inserted into the hole HH.

Figure 3A:
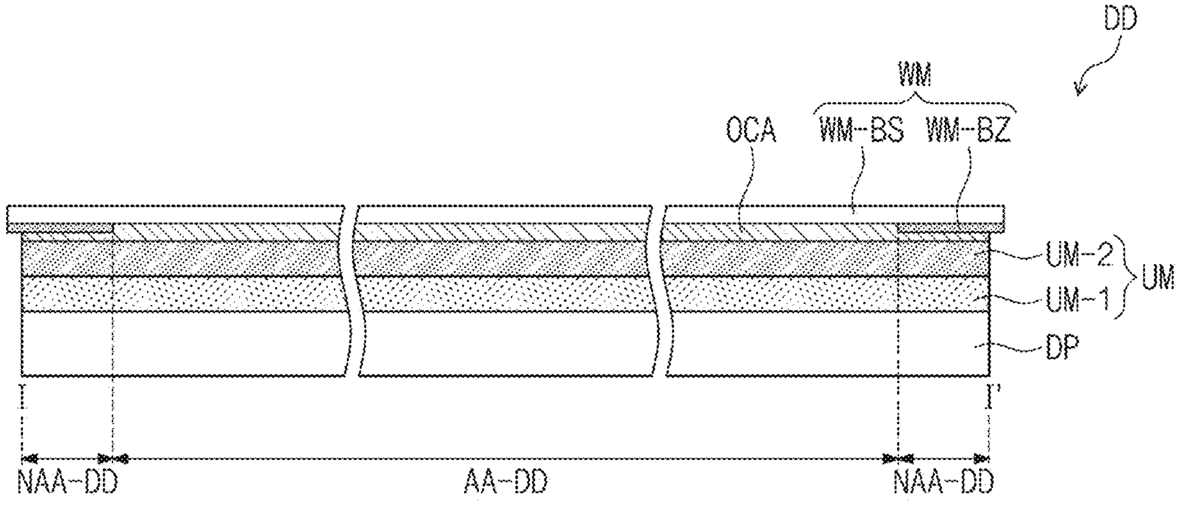
FIGS. 3A and 3B are cross-sectional views of an embodiment of a display device according to the invention.
Figure 3B:
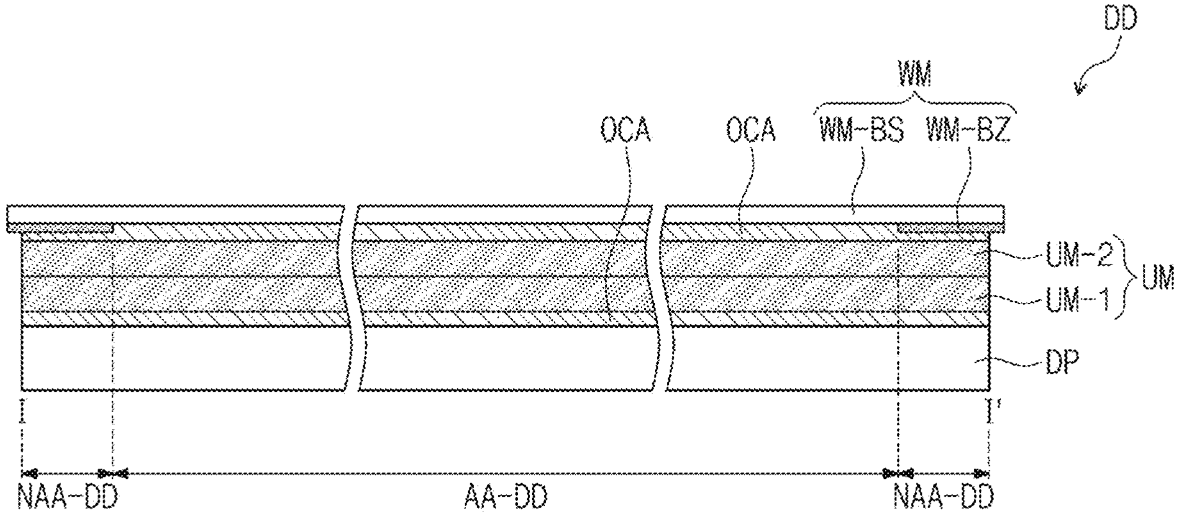

FIGS. 3A and 3B each are a cross-sectional view of a display device according to the invention. Hereinafter, the detailed description of the same elements as those described with reference to FIGS. 1 and 2 will be omitted.

As illustrated in FIGS. 3A and 3B, a display device DD includes a display panel DP, an upper member UM and a window WM. The upper member UM includes an input detection sensor UM-1 and an optical film UM-2. As illustrated in FIGS. 3A and 3B, the window WM and the optical film UM-2 may be bonded through an adhesive layer OCA.

Although the optical film UM-2 is not illustrated in detail, the optical film UM-2 may have a multilayer structure, and the multilayer structure may include an adhesive layer. The optical film UM-2 may adhere to an upper surface of the input detection sensor UM-1 by the adhesive layer.

In the optical film UM-2, an opening region may be defined to correspond to the sensing region SSA illustrated in FIG. 2. The opening region may improve the transmittance of a natural light signal.

As illustrated in FIGS. 3A and 3B, the window WM may include a base substrate WM-BS and a bezel pattern WM-BZ. The base substrate WM-BS includes a transparent substrate such as a glass substrate. The bezel pattern WM-BZ may have a multilayer structure. A region in which the bezel pattern WM-BZ is disposed may correspond to the bezel region BZA illustrated in FIG. 2. The multilayer structure may include a colored color layer and a black light-shielding layer. The colored color layer and the black light-shielding layer may be formed or provided through a depositing, printing or coating process. In an alternative embodiment, the bezel pattern WM-BZ may be omitted.

The input detection sensor UM-1 illustrated in FIG. 3A may be disposed directly on a base surface provided by the display panel DP. In the disclosure, "an element B being disposed directly on an element A" means that a separate adhesive layer/bonding layer is not disposed between the element A and the element B. After the element A is formed, the element B is formed through a continuous process on a base surface provided by the element A.

As illustrated in FIG. 3B, the input detection sensor UM-1 may be coupled to the display panel DP after separately manufactured. An adhesive layer OCA may be disposed between the input detection sensor UM-1 and the display panel DP.

Figure 4A:
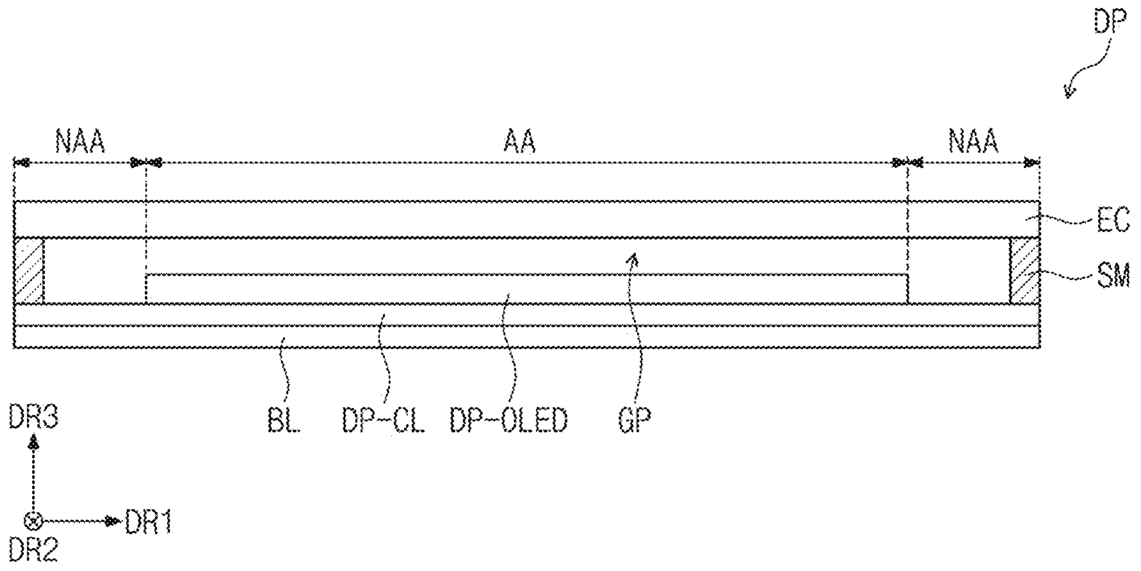
FIGS. 4A and 4B are cross-sectional views of an embodiment of a display panel according to the invention.
Figure 4B:
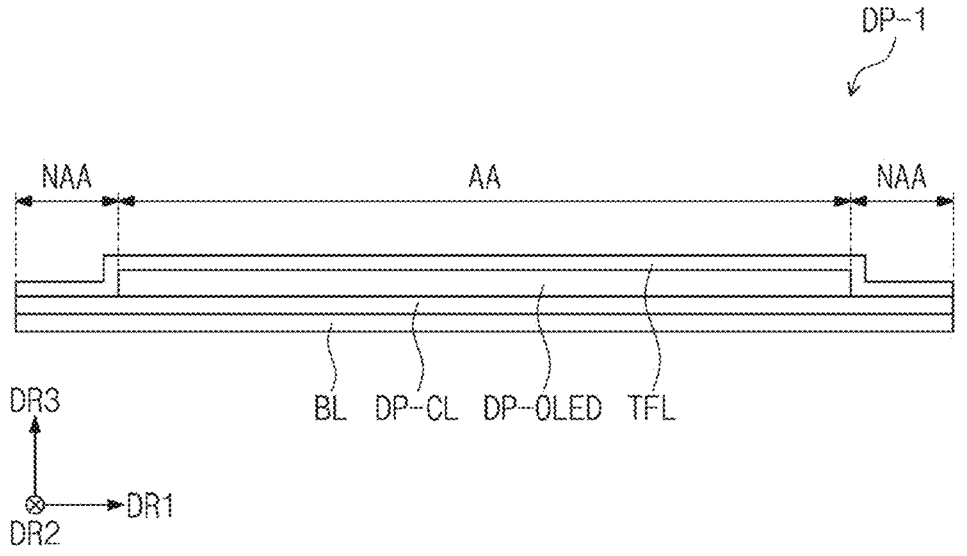

FIG. 4A is a cross-sectional view of an embodiment of a display panel according to the invention. FIG. 4B is a cross-sectional view of an embodiment of a display panel according to the invention.

As illustrated in FIG. 4A, a display panel DP includes a base layer BL, a circuit layer DP-CL disposed on the base layer BL, a light-emitting element layer DP-OLED, an encapsulation substrate EC, and a sealing member SM.

The base layer BL in an embodiment may include a glass substrate. In addition, the base layer BL may include a substrate having a substantially constant refractive index in a wavelength range of visible light.

The encapsulation substrate EC in an embodiment may be a transparent substrate. The encapsulation substrate EC may include a glass substrate. In addition, the encapsulation substrate EC may include a substrate having a substantially constant refractive index in a wavelength range of visible light. The sealing member SM may bond the base layer BL and the encapsulation substrate EC. The sealing member SM may extend along an edge of the encapsulation substrate EC.

A gap GP defined inside the display panel DP may be in a vacuum state. However, the invention is not limited thereto, and the gap GP may be filled with air or inert gases (hereinafter an external gas). The encapsulation substrate EC and the sealing member SM may prevent moisture from being introduced into the display panel DP.

The sealing member SM may include an inorganic adhesive layer such as a frit. However, the invention is not limited thereto, and the sealing member SM may include an organic adhesive layer. In this embodiment, the display panel DP may be completely sealed from the outside, thereby improving the strength and preventing a defect of a light-emitting element.

The circuit layer DP-CL includes at least one insulation layer, semiconductor patterns, and conductive patterns. The insulation layer includes at least one inorganic layer and at least one organic layer. The semiconductor patterns and the conductive patterns may constitute signal lines, a pixel driving circuit and a scan driving circuit. This will be described in detail later.

The light-emitting element layer DP-OLED includes a display element, e.g., an organic light-emitting diode. The light-emitting element layer DP-OLED may further include an organic layer such as a pixel defining film.

As illustrated in FIG. 4A, a display region AA and a non-display region NAA corresponding to the active region AA-DD (refer to FIG. 1) and the peripheral region NAA-DD (refer to FIG. 1) may be defined in the display panel DP. In this embodiment, regions of different members corresponding to each other means the regions overlapping each other, and is not limited to the regions having the same area/shape.

Referring to FIG. 4B, a display panel DP-1 in another embodiment of the invention does not include an encapsulation substrate EC and a sealing member SM, when compared to the display panel DP illustrated in FIG. 4A. The display panel DP-1 in an embodiment includes a base layer BL, a circuit layer DP-CL disposed on the base layer BL, a light-emitting element layer DP-OLED, and an upper insulation layer TFL. In addition, the base layer BL may include a plastic substrate, a glass substrate, a metal substrate, an organic/inorganic composite material substrate, or the like. The base layer BL may include at least one polyimide layer.

The upper insulation layer TFL includes a plurality of thin films. Some thin films are disposed so as to improve the optical efficiency, and some thin films are disposed so as to protect organic light-emitting diodes. The upper insulation layer TFL may include a thin film encapsulation layer including a stacked structure of inorganic layer/organic layer/inorganic layer.

The base layer BL may include a glass substrate. In addition, the base layer BL may include a substrate having a substantially constant refractive index in a wavelength range of visible light.

Hereinafter, an embodiment of the invention will be described based on the display panel DP in FIG. 4A.

Figure 5A:
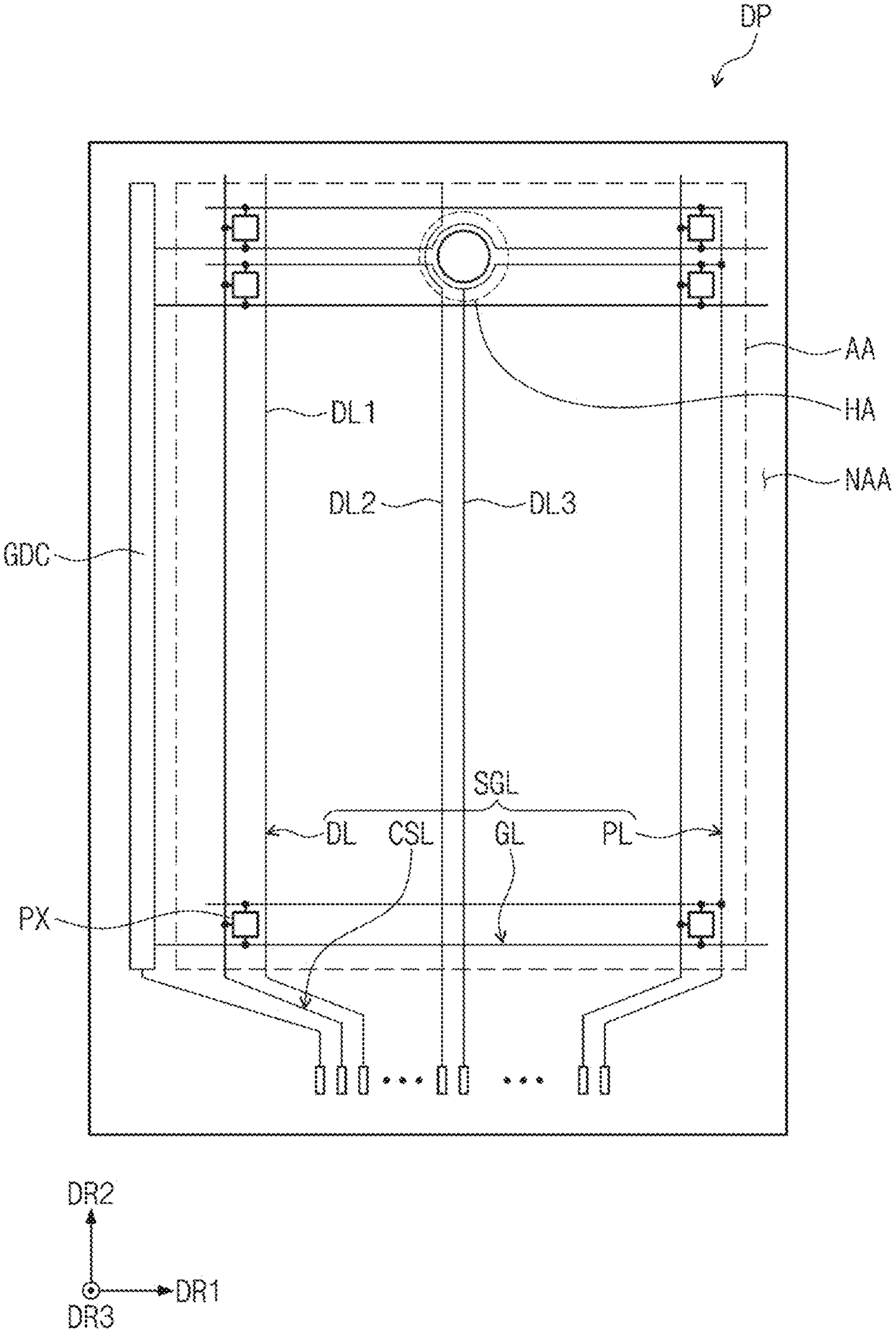
FIG. 5A is a plan view of an embodiment of a display panel according to the invention.
Figure 5B:
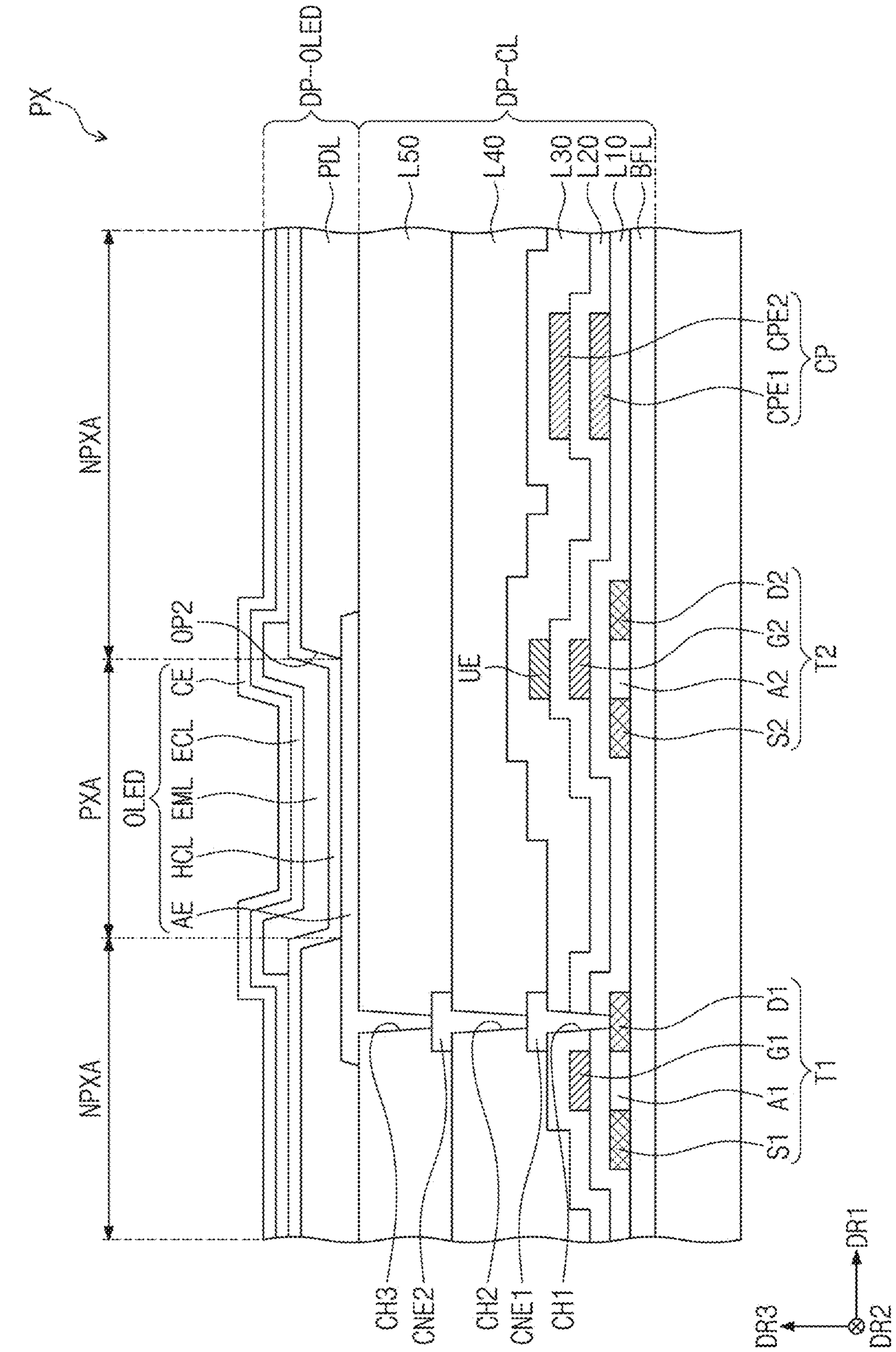
FIG. 5B is a cross-sectional view of an embodiment of a display panel according to the invention.

FIG. 5A is a plan view of an embodiment of a display panel according to the invention. FIG. 5B is a cross-sectional view of an embodiment of a display panel according to the invention.

Referring to FIG. 5A, a display region AA and a non-display region NAA may be defined in the display panel DP. The non-display region NAA may correspond to the peripheral region NAA-DD (refer to FIG. 1) of the electronic device ED (refer to FIG. 1). A hole region HA corresponding to the sensing region SA-DD (refer to FIG. 1) of the electronic device ED (refer to FIG. 1) may be defined in the display region AA.

The display panel DP may include a plurality of signal lines SGL (hereinafter signal lines), a plurality of pixels PX (hereinafter pixels), and a driving circuit GDC. The pixels PX are disposed in the display region AA. The pixels PX each include an organic light-emitting diode and a pixel driving circuit connected thereto. The signal lines SGL and the pixel driving circuit may be included in the circuit layer DP-CL illustrated in FIG. 5A.

The pixels PX are not disposed in the hole region HA. A light signal supplied from an electronic module ELM or entering the electronic module ELM may move through the hole region HA. The hole region HA may have a higher light transmittance than that of the display region AA.

The driving circuit GDC is disposed in the non-display region NAA. In this embodiment, the driving circuit GDC may include a scan driving circuit. The scan driving circuit generates a plurality of scan signals (hereinafter scan signals), and outputs the scan signals to a plurality of scan lines GL (hereinafter scan lines), which will be descried later, in sequence. The scan driving circuit may further output another control signal to the driving circuit of the pixels PX.

The scan driving circuit may include a plurality of thin film transistors that are formed or provided through the same process as the driving circuit of the pixels PX, e.g., through a low temperature polycrystalline silicon ("LTPS") process or a low temperature polycrystalline oxide ("LTPO") process.

The signal lines SGL include scan lines GL, data lines DL, a power line PL and a control signal line CSL. The signal lines SGL may further include separate reset lines and light-emitting lines. Each of the scan lines GL is connected to a corresponding pixel PX among the pixels PX, and each of the data lines DL is connected to a corresponding pixel PX among the pixels PX. The power line PL is connected to the pixels PX. The control signal line CSL may provide the scan driving circuit with control signals.

The signal lines SGL may be connected to a circuit board which is not illustrated. The signal lines SGL may be connected to a timing control circuit having a shape of an integrated chip disposed (e.g., mounted) on the circuit board.

The data lines DL may include three types of data lines. A first type of data line DL1 is connected to all pixels PX disposed in a corresponding pixel column. The first type of data line DL1 is spaced far apart from the hole region HA. A second type of data line DL2 is connected to all pixels PX disposed in a corresponding pixel column, and is adjacent to the hole region HA. In addition, the second type of data line DL2 is connected to some of pixels PX disposed in another pixel column adjacent to the corresponding pixel column. A portion of the second type of data line DL2 extends along the hole region HA. A third type of data line DL3 is connected to some of pixels PX disposed in a corresponding pixel column, and is shorter than the first type of data line DL1. An end of the third type of data line DL3 is adjacent to the hole region HA.

FIG. 5B illustrates a cross section of a pixel PX corresponding to two transistors T1 and T2 and a light-emitting element OLED that constitute a pixel driving circuit. A base layer BL in an embodiment may include a glass substrate. In this embodiment, a circuit layer DP-CL may include a plurality of insulation layers. The plurality of insulation layers may include inorganic layers, i.e., a buffer layer BFL, a first intermediate inorganic layer L10, a second intermediate inorganic layer L20 and a third intermediate inorganic layer L30, and organic layers, i.e., a first intermediate organic layer L40 and a second intermediate organic layer L50.

A semiconductor pattern is disposed on the buffer layer BFL. The semiconductor pattern may include a silicon semiconductor. A first semiconductor pattern may include polysilicon. However, the invention is not limited thereto, and the first semiconductor pattern may also include amorphous silicon. The semiconductor pattern may include a metal oxide semiconductor.

The semiconductor pattern has different electrical properties according to whether to be doped or not. The semiconductor pattern may include a first doped region with high conductivity, and a second doped region with low conductivity. The first doped region may be doped with an N-type dopant or P-type dopants. A P-type transistor includes a doped region doped with the P-type dopant. The second doped region may be an undoped region or may be doped with the doping concentration lower than that of the first doped region.

The first doped region has higher conductivity than that of the second doped region, and substantially serves as an electrode or a signal line. The second doped region substantially corresponds to an active (or channel) of the transistor. In other words, one portion of the semiconductor pattern may be an active (or channel) of the transistor, another portion may be a source (or input electrode region) or a drain (or output electrode region) of the transistor, and still another portion may be a connection signal line (or connection electrode).

As illustrated in FIG. 5B, a source S1, an active A1 and a drain D1 of a first transistor T1 are formed or provided from the semiconductor pattern, and a source S2, an active A2 and a drain D2 of a second transistor T2 are formed or provided from the semiconductor pattern. The source S1 and S2 and the drain D1 and D2 extend from the actives A1 and A2 in opposite directions on a cross section.

Control electrodes G1 and G2 are disposed on the first intermediate inorganic layer L10 to overlap the actives A1 and A2, respectively. A first capacitor electrode CPE1 of a capacitor CP is disposed on the first intermediate inorganic layer L10. A second capacitor electrode CPE2 of the capacitor CP is disposed on the second intermediate inorganic layer L20. An upper electrode UE overlapping the control electrode G2 may be disposed on the second intermediate inorganic layer L20.

A first connection electrode CNE1 may be disposed on the third intermediate inorganic layer L30. The first connection electrode CNE1 may be connected to the drain D1 of the first transistor T1 through a first through-hole CH1. A second connection electrode CNE2 may be disposed on the first intermediate organic layer L40. The second connection electrode CNE2 may be connected to the first connection electrode CNE1 through a second through-hole CH2. Although not illustrated, conductive patterns different from the first connection electrode CNE1 may be disposed on the third intermediate inorganic layer L30, and conductive patterns different from the second connection electrode CNE2 may be disposed on the first intermediate organic layer L40. These conductive patterns may constitute the signal line illustrated in FIG. 5A, e.g., a data line DL.

A first electrode AE is disposed on the second intermediate organic layer L50. The first electrode AE may be connected to the second connection electrode CNE2 through a third through-hole CH3. A pixel defining film PDL exposes at least a portion of the first electrode AE. Specifically, at least a portion of the first electrode AE is exposed by a light-emitting opening OP2 defined in the pixel defining film PDL.

The pixel defining film PDL may be disposed directly on an uppermost insulation layer among the plurality of insulation layers included in the circuit layer DP-CL. In an embodiment, as illustrated in FIG. 5B, the pixel defining film PDL may be disposed directly on the second intermediate organic layer L50, for example.

A display region AA may include a light-emitting region PXA and a non-light-emitting region NPXA adjacent to the light-emitting region PXA. The non-light-emitting region NPXA may surround the light-emitting region PXA. In this embodiment, the light-emitting region PXA is defined corresponding to a partial region of the first electrode AE exposed by the pixel defining film PDL.

A hole control layer HCL may be disposed, in common, in the light-emitting region PXA and the non-light-emitting region NPXA. The hole control layer HCL may include a hole transport layer and further include a hole injection layer. A light-emitting layer EML is disposed on the hole control layer HCL. The light-emitting layer EML may be disposed corresponding to the first electrode AE exposed by the pixel defining film PDL. That is, the light-emitting layer EML may be divided in each of the pixels. The light-emitting layer EML may include an organic matter and/or an inorganic matter. The light-emitting layer EML may generate color light having a predetermined color.

An electron control layer ECL is disposed on the light-emitting layer EML. The electron control layer ECL may include an electron transport layer and further include an electron injection layer. The hole control layer HCL and the electron control layer ECL may be formed or provided, in common, in the plurality of pixels using an open mask. A second electrode CE is disposed on the electron control layer ECL. The second electrode CE is disposed, in common, in the plurality of pixels.

Figure 6A:
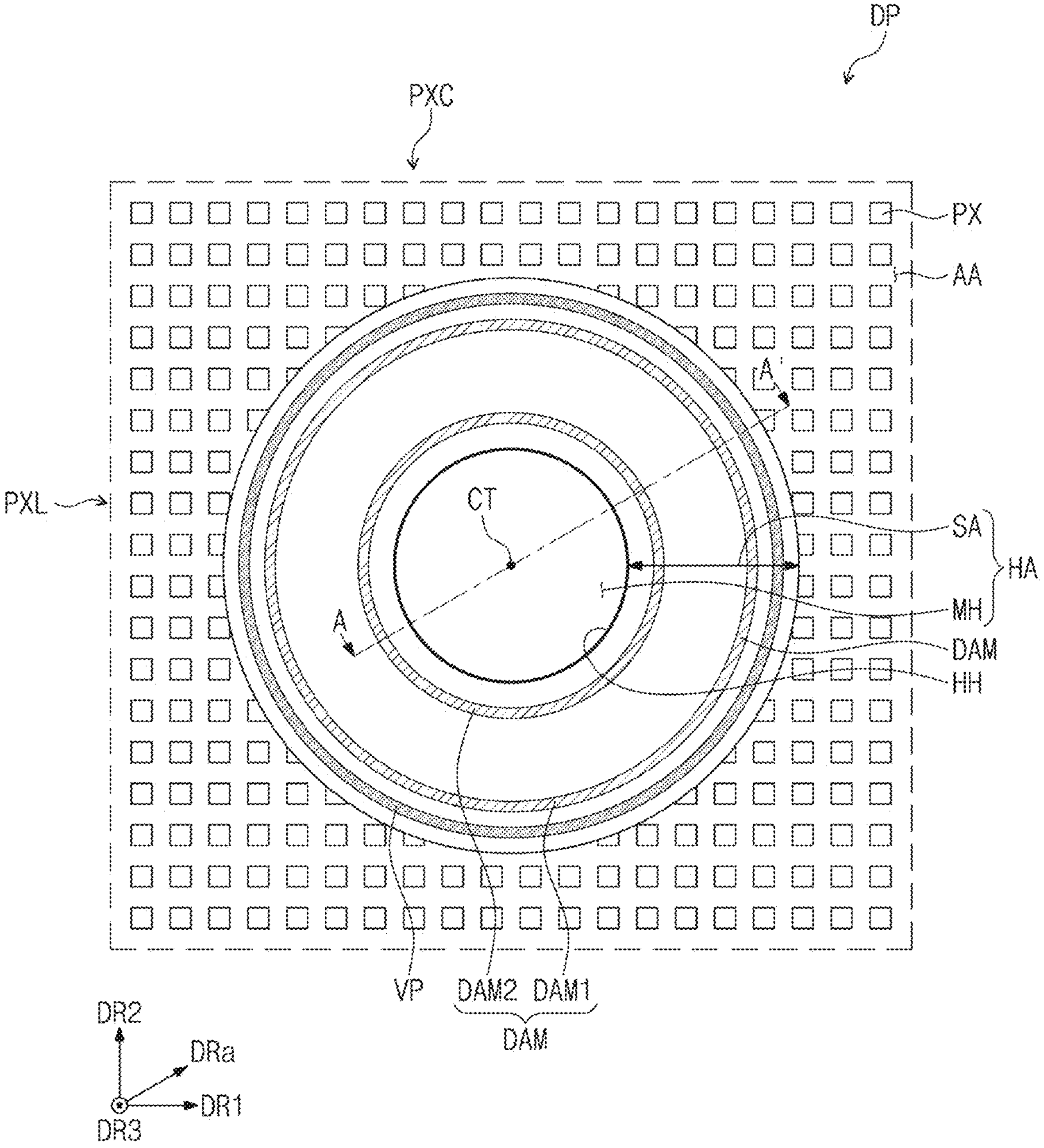
FIG. 6A is an enlarged plan view of an embodiment of a portion of a display panel according to the invention.
Figure 6B:
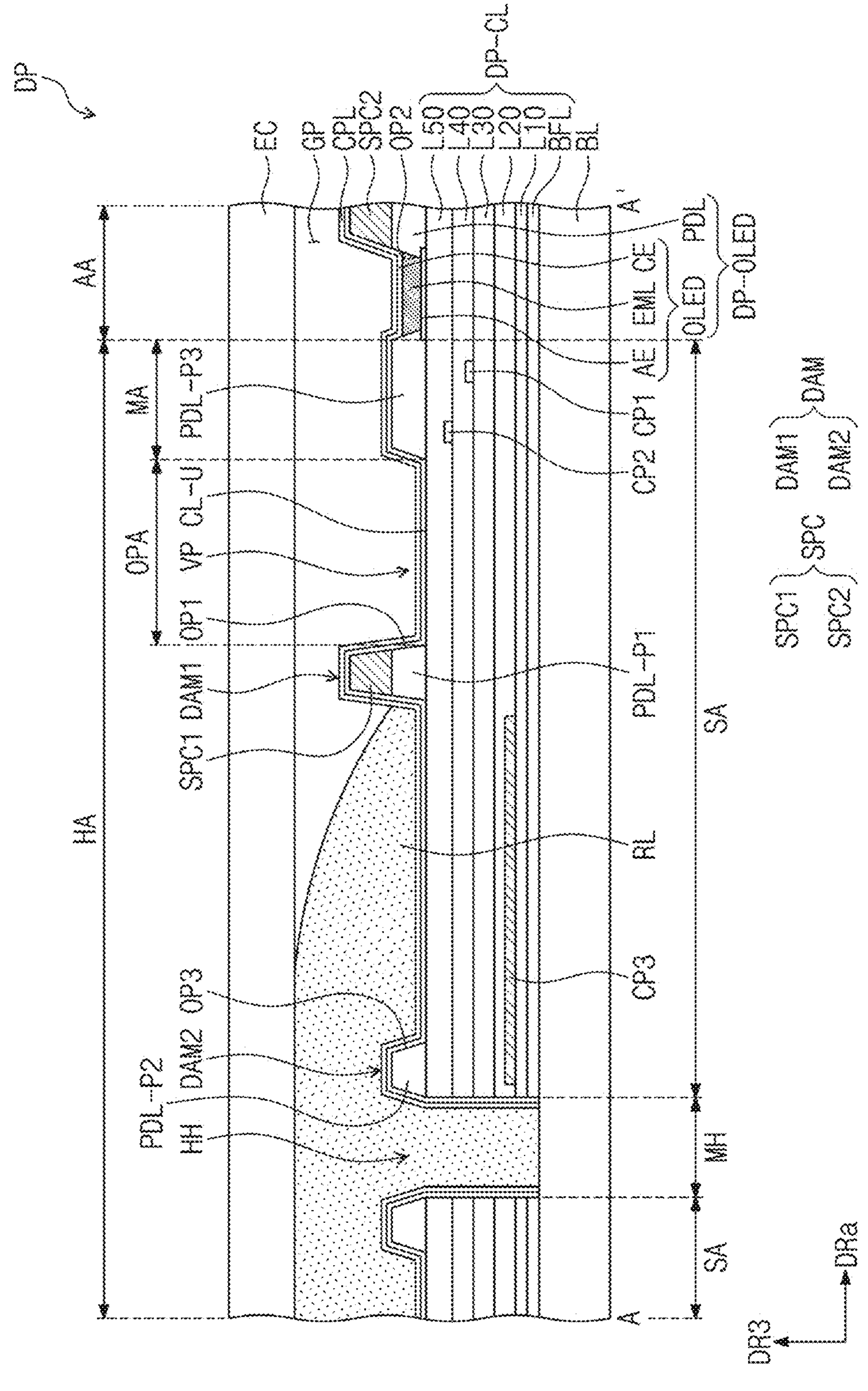
FIG. 6B is a cross-sectional view of an embodiment of a portion of a display panel according to the invention.

FIG. 6A is an enlarged plan view of an embodiment of a portion of a display panel according to the invention. FIG. 6B is a cross-sectional view of a portion of an embodiment of a display panel according to the invention. FIG. 6A illustrates a hole region HA and a partial display region AA therearound in a display panel DP. FIG. 6B illustrates a cross section taken along the cutting plane line A-A' in FIG. 6A. Hereinafter, an extending direction of the cutting plane line A-A' illustrated in FIG. 6A may be also referred to as one direction DRa.

Referring to FIG. 6A, pixels PX may be disposed in the display region AA. The pixels PX arranged in the second direction DR2 define pixel rows PXL and the pixels PX arranged in the first direction DR1 define pixel columns PXC. The hole region HA may disconnect some pixel rows PXL and some pixel columns PXC.

Referring to FIG. 6A, in the display panel DP in an embodiment, a hole HH is defined in the hole region HA. In an embodiment, the hole HH may have a shape recessed from an upper component of the display panel DP. In an embodiment, as illustrated in FIG. 6B, the hole HH may be an opening defined from an upper surface of a light-emitting element layer DP-OLED to an upper surface of a base layer BL in the display panel DP, for example. The upper surface of the base layer BL may be exposed by the hole HH, and a light compensation layer RL may contact the exposed upper surface of the base layer BL. However, the invention is not limited thereto, and the hole HH may be an opening defined from the upper surface of the light-emitting element layer DP-OLED to at least a portion of a circuit layer DP-CL. In an embodiment, a separate opening or groove corresponding to the hole HH may not be defined in the base layer BL. However, the invention is not limited thereto, and the opening or groove may be defined in the base layer BL. When an opening corresponding to the hole HH is defined in the base layer BL, the hole HH of the display panel DP may be a through-hole that penetrates the entirety of the display panel DP.

In an embodiment, the hole HH may include a circular shape having a hole center CT. The hole HH may have a circular shape with a constant radius about the hole center CT in a plan view. However, the invention is not limited thereto, and the hole HH may have a polygonal shape. In addition, the hole HH may be provided in plural.

The pixels PX may not be disposed in the hole region HA. The hole region HA may include a signal transmission region MH and a peripheral region SA adjacent to the signal transmission region MH. The signal transmission region MH may be a region corresponding to the hole HH. The peripheral region SA may surround the signal transmission region MH.

A dam DAM and a valley section VP that surround the hole HH are disposed on the peripheral region SA. The dam DAM and the valley section VP may each have a closed curve shape disposed along the circumference of the hole HH. The dam DAM and the valley section VP may each be disposed to have an annular shape with a constant radius about the hole center CT in a plan view. The dam DAM and the valley section VP may control a flow of the light compensation layer RL provided in the hole HH. Since the dam DAM and the valley section VP may each have a closed curve shape, a fluid that is filled in the hole HH and forms the light compensation layer RL may be prevented from flowing over the peripheral region SA into the display region AA.

In the display panel DP in an embodiment, the dam DAM may be provided in plural. The dam DAM may include a first dam DAM1 and a second dam DAM2. The first dam DAM1 may be adjacent to the valley section VP, and the second dam DAM2 may be closer to the hole HH than the first dam DAM1 is. In a plan view, a distance from the hole center CT to the second dam DAM2 may be shorter than a distance from the hole center CT to the first dam DAM1. The first dam DAM1 and the second dam DAM2 may each have a closed curve shape surrounding the hole HH and disposed along the circumference of the hole HH. The first dam DAM1 and the second dam DAM2 may each have an annular shape with a constant radius about the hole center CT.

The first dam DAM1 may be an outermost dam spaced farthest apart from the hole center CT, among the dams DAM provided in plural. In an embodiment, unlike the illustrations in FIGS. 6A and 6B, even when the dam DAM includes three or more dams, the first dam DAM1 may be spaced farthest apart from the hole center CT and the other dams may each have an annular shape having a shorter radius than that of the first dam DAM1.

The valley section VP may be farther apart from the hole center CT than the dam DAM is. The valley section VP may have a annular shape with a larger radius about the hole center CT than that of the dam DAM. The valley section VP may be spaced farther apart from the hole center CT than the first dam DAM1 that is an outermost dam spaced farthest apart from the hole center CT, among the dams DAM provided in plural, is. The valley section VP may be closer to the display region AA than the dam DAM is.

The valley section VP may be defined to have a shape recessed from a top surface of some of components included in the light-emitting element layer DP-OLED. In an embodiment, as illustrated in FIG. 6B, the valley section VP may be defined by a first opening OP1 (refer to FIG. 6B) defined in a pixel defining film PDL.

Referring to FIG. 6B, a display panel DP may include a base layer BL, a circuit layer DP-CL, a light-emitting element layer DP-OLED and a capping layer CPL.

The light-emitting element layer DP-OLED may include a light-emitting element OLED and a pixel defining film PDL. The capping layer CPL may be disposed on the light-emitting element layer DP-OLED. The capping layer CPL is disposed on a second electrode CE and in contact with the second electrode CE. The capping layer CPL may include an organic matter. The capping layer CPL protects the second electrode CE from a subsequent process, e.g., a sputtering process, and improves the light emission efficiency of the light-emitting element OLED. The capping layer CPL may have a refractive index of about 1.6 or higher. Specifically, the capping layer CPL may have a refractive index of about 1.6 or higher with respect to light in a wavelength range of about 550 nm to about 660 nm. In an alternative embodiment, the capping layer CPL disposed on the light-emitting element layer DP-OLED may be omitted. When the capping layer CPL is omitted, another component may not be disposed on the second electrode CE and a gap may be defined thereon.

A signal line may be disposed in a portion of the display region AA and the peripheral region SA. The signal line may be a conductive pattern formed or provided through the same process as the first connection electrode CNE1 or the second connection electrode CNE2 described with reference to FIG. 5B. FIG. 6B illustrates a first signal line CP1 disposed on a third intermediate inorganic layer L30, and a second signal line CP2 disposed on a first intermediate organic layer L40. The first signal line CP1 and the second signal line CP2 may be signal lines distinct from each other, or may be connected through a contact hole that penetrates the third intermediate inorganic layer L30. That is, the first signal line CP1 and the second signal line CP2 may be portions, disposed on different layers, of a single signal line.

The signal line may further include a third signal line CP3. The third signal line CP3 may be distinct from the first signal line CP1 and the second signal line CP2, and may be disposed in a layer different from those on which the first signal line CP1 and the second signal line CP2 are disposed. The third signal line CP3 may be a conductive pattern formed or provided through the same process as the source S1 and S2, the drain D1 and D2, or the control electrode G1 and G2 described with reference to FIG. 5B. FIG. 6B illustrates that the third signal line CP3 is disposed on a second intermediate inorganic layer L20. However, the invention is not limited thereto, and the third signal line CP3 may be disposed on a first intermediate inorganic layer L10. In an embodiment, the third signal line CP3 may be disposed in the peripheral region SA, and may not overlap the first dam DAM1.

A plurality of different openings may be defined in the pixel defining film PDL. The pixel defining film PDL may expose at least a portion of a first electrode AE, and a light-emitting opening OP2 in which a light-emitting layer EML is disposed may be defined in the pixel defining film PDL. A first opening OP1 and a second opening OP3 may be defined in the pixel defining film PDL in the peripheral region SA.

The first opening OP1 may be defined in the peripheral region SA and defined between the first dam DAM1 and the display region AA. A valley section VP may be defined by the first opening OP1. The valley section VP may be a portion which has a smaller height than another portion adjacent thereto and is formed or provided by removing the pixel defining film PDL. An uppermost insulation layer among a plurality of insulation layers included in the circuit layer DP-CL, e.g., an upper surface CL-U of a second intermediate organic layer L50, may be exposed by the first opening OP1 that defines the valley section VP. The pixel defining film PDL may not be disposed on the upper surface CL-U exposed by the first opening OP1, and a second electrode CE that is an upper component may be disposed directly thereon.

The second opening OP3 may be defined in the peripheral region SA and defined between the first dam DAM1 and the second dam DAM2. A portion, which is formed or provided by removing the pixel defining film PDL and in which the second opening OP3 is defined, may have a smaller height than another portion adjacent thereto. The uppermost insulation layer among the plurality of insulation layers included in the circuit layer DP-CL, e.g., the upper surface CL-U of the second intermediate organic layer L50, may be exposed by the second opening OP3.

The pixel defining film PDL may be divided into a plurality of portions by the plurality of openings OP1, OP2 and OP3 defined in the pixel defining film PDL. The pixel defining film PDL may include a first portion PDL-P1 included in the first dam DAM1, a second portion PDL-P2 included in the second dam DAM2, and a third portion PDL-P3 spaced apart from the first portion PDL-P1 with the first opening OP1 therebetween. The third portion PDL-P3 may be a portion between the first opening OP1 and the light-emitting element OLED.

In an embodiment, in the peripheral region SA, a region in which the first opening OP1 is defined may be referred to as an opening region OPA. The opening region OPA may be a region between a portion in which the first dam DAM1 is disposed, and the third portion PDL-P3 of the pixel defining film PDL.

The peripheral region SA may include an intermediate region MA defined between the opening region OPA and the display region AA. The intermediate region MA may be a region, between the first opening OP1 and the light-emitting element OLED, of the peripheral region SA. The intermediate region MA may be a region, overlapping the third portion PDL-P3, of the peripheral region SA.

In the display panel DP in an embodiment, the light-emitting element layer DP-OLED may include a spacer SPC disposed on the pixel defining film PDL. The spacer SPC may be a component for maintaining a gap between an encapsulation substrate EC disposed thereabove, and lower components. FIG. 6B illustrates that the spacer SPC is spaced apart from the encapsulation substrate EC by a predetermined gap. However, the invention is not limited thereto, and an upper surface of the spacer SPC may contact a lower surface of the encapsulation substrate EC.

The spacer SPC may include a first spacer SPC1 disposed on the first portion PDL-P1 of the pixel defining film PDL. The first dam DAM1 may be formed or provided through the first spacer SPC1, the first portion PDL-P1, and the plurality of insulation layers BFL, L10, L20, L30, L40 and L50, disposed therebelow, of the circuit layer DP-CL.

The first dam DAM1 may include the first spacer SPC1 and thus have a greater height than that of the second dam DAM2. In an embodiment, while the second dam DAM2 includes the second portion PDL-P2 alone and does not include the spacer, the first dam DAM1 may include the first portion PDL-P1 and the first spacer SPC1 disposed on the first portion PDL-P1 and thus have a greater height than the that of second dam DAM2.

The spacer SPC may include a second spacer SPC2 disposed on a portion of the display region AA. The second spacer SPC2 may be disposed on the pixel defining film PDL between a plurality of light-emitting elements OLED. That is, the second spacer SPC2 may be disposed on a portion of the non-light-emitting region NPXA (refer to FIG. 5B) described above.

The second spacer SPC2 may be disposed between the respective plurality of light-emitting elements OLED, and may not be disposed between the peripheral region SA and a light-emitting element OLED, most adjacent to the peripheral region SA, among the plurality of light-emitting elements OLED. That is, the second spacer SPC2 may not be disposed on the third portion PDL-P3 of the pixel defining film PDL. The second spacer SPC2 may not overlap the intermediate region MA and the partial display region AA adjacent thereto. Another organic layer component, such as a spacer, may not be disposed on the third portion PDL-P3. Since a spacer is not disposed on the third portion PDL-P3, the third portion PDL-P3 may have a smaller height than that of the first dam DAM1 on which the first spacer SPC1 is disposed, or a portion on which the second spacer SPC2 is disposed between the light-emitting elements OLED.

In an embodiment, a width of the valley section VP defined by the first opening OP1 may be about 20 micrometers to about 50 micrometers. The width of the valley section VP may be measured based on the one direction DRa in which the cutting plane line A-A' defining the cross section of FIG. 6B extends. The width of the valley section VP in the one direction DRa may be about 30 micrometers. When the width of the valley section VP is less than about 20 micrometers, the effect of preventing an overflow defect of the light compensation layer RL may be reduced. When the width of the valley section VP is greater than about 50 micrometers, a width of the peripheral region SA may increase to result in an increase in a dead space of an electronic device.

In an embodiment, a width of the dam DAM may be about 20 micrometers to about 40 micrometers. The width of the dam DAM may be measured based on the one direction DRa described above. The width of each of the first dam DAM1 and the second dam DAM2 may be about 20 micrometers to about 40 micrometers. The width of the first dam DAM1 in the one direction DRa may be about 33 micrometers, and the width of the second dam DAM2 in the one direction DRa may be about 30 micrometers. When the width of the dam DAM is less than about 20 micrometers, the effect of preventing an overflow defect of the light compensation layer RI, may be reduced. When the width of the dam DAM is greater than about 40 micrometers, the width of the peripheral region SA may increase to result in an increase in a dead space of the electronic device.

In an embodiment, a width of the intermediate region MA may be about 30 micrometers to about 50 micrometers. The width of the intermediate region MA may be measured based on the one direction DRa described above. The width of the intermediate region MA in the one direction DRa may be about 40 micrometers. The spacer SPC may not be disposed on a portion, overlapping the intermediate region MA, of the pixel defining film PDL. That is, the spacer SPC may not overlap the intermediate region MA. When the width of the intermediate region MA is less than about 30 micrometers, the effect of preventing a defect in which the light compensation layer RL permeates a crack portion of the spacer on the occasion of overflow of the light compensation layer RL, may be reduced. When the width of the intermediate region MA is greater than about 50 micrometers, the width of the peripheral region SA may increase to result in an increase in a dead space of the electronic device, and a width of a portion in which the spacer is not disposed may increase to result in a defect in which a portion of the electronic device is damaged by an external pressure. The width of the intermediate region MA may be substantially the same as a width of the third portion PDL-P3. That is, the width of the third portion PDL-P3 may be about 30 micrometers to about 50 micrometers.

The display panel DP in an embodiment includes the light compensation layer RL overlapping the hole HH. The light compensation layer RL may adjust the transmittance of a signal transmission region MH and prevent a multiple reflection interference ("MRI") phenomenon. The light compensation layer RL may be disposed on a capping layer CPL.

The light compensation layer RL may overlap a portion of the hole region HA. The light compensation layer RL may overlap at least the signal transmission region MH and overlap a portion of the peripheral region SA. The encapsulation substrate EC may be disposed on the light compensation layer RL. The light compensation layer RL may contact a lower surface of the encapsulation substrate EC. A gap GP between the encapsulation substrate EC and the light compensation layer RL, or between the encapsulation substrate EC and the capping layer CPL, may be in a vacuum state. In a portion overlapping the hole region HA, the base layer BL, the light compensation layer RL and the encapsulation substrate EC are stacked in sequence, and another component may not be disposed among the base layer BL, the light compensation layer RL and the encapsulation substrate EC. In the portion overlapping the hole region HA in an embodiment, only the optically transparent base layer BL, light compensation layer RL and encapsulation substrate EC are stacked in sequence, thereby improving the transmittance of a light signal output from the electronic module ELM (refer to FIG. 2) overlapping the hole region HA, or the transmittance of a light signal entering the electronic module ELM (refer to FIG. 2) from the outside.

In an embodiment, the light compensation layer RL may be obtained by curing a fluid having viscosity and liquidity. In an embodiment, the light compensation layer RL may be obtained by curing a liquid silicon (S1)-based material, for example. However, the invention is not limited thereto, and the light compensation layer RI, may be obtained by curing an organic matter. Specifically, after the fluid is provided between the encapsulation substrate EC and the display panel DP to overlap the hole HH, the fluid may flow from the hole HH toward the dam DAM while the encapsulation substrate EC is pressed against the display panel DP. The fluid may be cured during flowing from the hole HH toward the dam DAM, and the cured fluid may form the light compensation layer RL. The light compensation layer RL may contact a portion of the dam DAM. In an embodiment, the light compensation layer RL may cover the second dam DAM2 and contact a portion of the first dam DAM1, for example.

Figure 7:
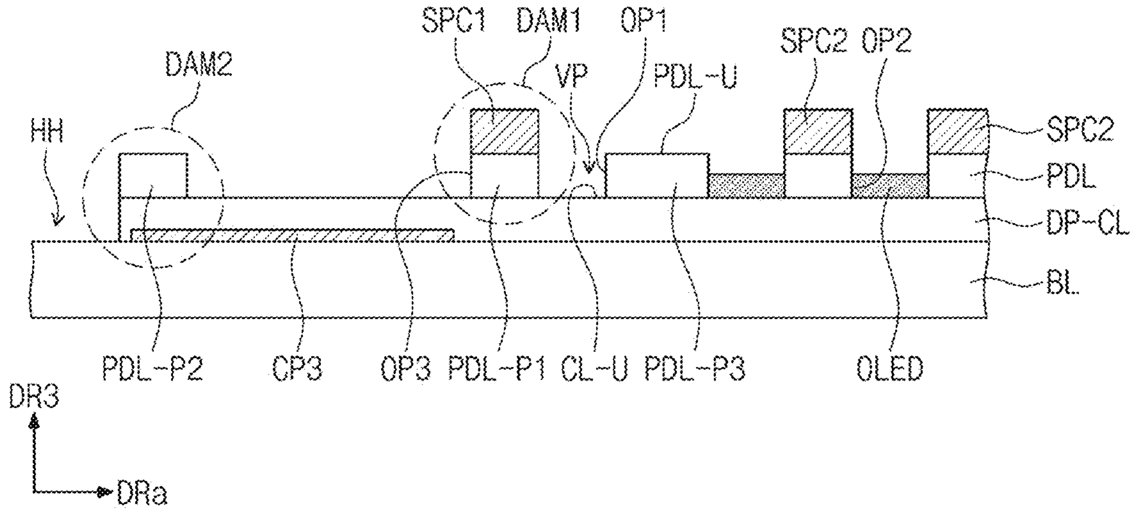
FIGS. 7 and 8 are cross-sectional views of an embodiment of a portion of a display panel according to the invention.
Figure 8:
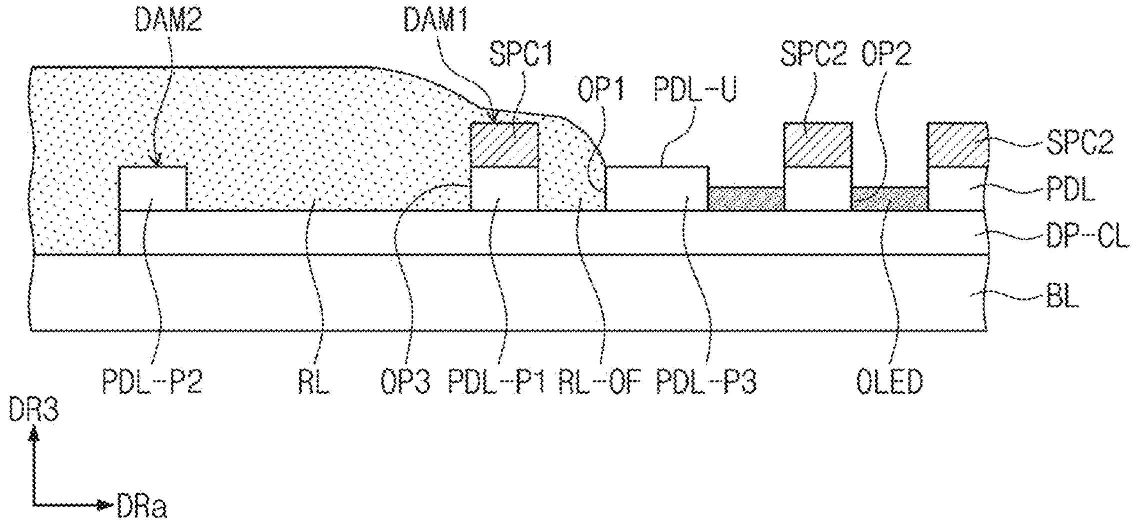

FIGS. 7 and 8 each are a cross-sectional view of an embodiment of a portion of a display panel according to the invention. FIGS. 7 and 8 each simply illustrate components remaining after omitting some components from a cross section corresponding to FIG. 6B.

Referring to FIGS. 7 and 8, a display panel DP includes a base layer BL and a circuit layer DP-CL, and the light-emitting element layer DP-OLED (refer to FIG. 6B) disposed on the circuit layer DP-CL may include a pixel defining film PDL, a plurality of light-emitting elements OLED, and spacers SPC1 and SPC2.

The display panel DP includes a plurality of dams DAM1 and DAM2 disposed on the circuit layer DP-CL. A second dam DAM2, which is more adjacent to a hole HH than a first dam DAM1 is, may include a second portion PDL-P2 of the pixel defining film PDL. The first dam DAM1, which is more adjacent to the plurality of light-emitting elements OLED than the second dam DAM2 is, may include a first spacer SPC1 and a first portion PDL-P1 of the pixel defining film PDL.

As described above, the circuit layer DP-CL may include a signal line, and the signal line may include a third signal line CP3. The third signal line CP3 may be disposed in a peripheral region SA and may not overlap the first dam DAM1.

A first opening OP1 adjacent to the first dam DAM1 may be defined in the pixel defining film PDL. The first portion PDL-P1 and a third portion PDL-P3 of the pixel defining film PDL may be spaced apart by the first opening OP1, and a region in which the first opening OP1 is defined may be referred to as a valley section VP. An upper surface of the circuit layer DP-CL may be exposed by the valley section VP. The circuit layer DP-CL may include a plurality of insulation layers as described with reference to FIGS. 5B and 6B. An upper surface of an uppermost layer among the plurality of insulation layers included in the circuit layer DP-CL may be exposed by the valley section VP. The circuit layer DP-CL may include at least one inorganic layer and at least one organic layer. In an alternative embodiment, the circuit layer DP-CL may include a plurality of organic layers alone.

A second spacer SPC2 may be disposed on an upper surface of a portion, disposed between the plurality of light-emitting elements OLED, of the pixel defining film PDL. A spacer may not be disposed on the third portion PDL-P3, disposed between the first opening OP1 and the light-emitting element OLED, of the pixel defining film PDL. Accordingly, another component may not be disposed on an upper surface PDL-U of the third portion PDL-P3, and the upper surface PDL-U may be exposed.

Referring to FIGS. 6B, 7 and 8, in a display device DD in an embodiment of the invention, the valley section VP may be formed or provided in the peripheral region SA, by the first opening OP1 defined between a display region AA and the first dam DAM1 that is an outermost dam among the plurality of dams DAM1 and DAM2. Accordingly, even when a fluid that forms a light compensation layer RL flows over the first dam DAM1 in the display region AA direction, the overflowed fluid may be collected in the valley section VP and be thus prevented from being introduced into the display region AA. In an embodiment, as illustrated in FIG. 8, even when there is an overflowed portion RL-OF, having flowed over the first dam DAM1, of the fluid that forms the light compensation layer RL, the overflowed portion RL-OF may be collected in the valley section VP and not flow over the third portion PDL-P3, thereby preventing the light compensation layer RL from being introduced into the light-emitting element OLED disposed in the display region AA. Accordingly, a defect caused by the overflowed fluid may be prevented from occurring in pixels to improve the reliability of the display device. Unlike the illustration in FIG. 8, a portion of the upper surface PDL-U of the third portion PDL-P3 may contact the light compensation layer RL. At least a portion of the upper surface PDL-U of the third portion PDL-P3 may not contact the light compensation layer RL and be exposed without another component disposed thereon.

In addition, in the display device DD in an embodiment of the invention, a spacer may not be disposed on the third portion PDL-P3 of the pixel defining film PDL, i.e., a portion, between the first opening OP1 and a light-emitting element OLED most adjacent thereto, of the pixel defining film PDL, thereby preventing permeation of the fluid overflowed by a crack occurring in the spacer. When a spacer is disposed on the third portion PDL-P3, a crack may occur in the spacer during a pressure process or the like, and a fluid may permeate the crack and enter the light-emitting element OLED disposed in the display region AA to cause pixel shrinkage. However, since the spacer disposed on the third portion PDL-P3 is omitted, the fluid may be prevented from permeating the spacer crack even when there is the overflowed portion RL-OF, having flowed over the first dam DAM1, of the fluid that forms the light compensation layer RL. Therefore, a defect caused by the permeated fluid may be prevented from occurring in pixels to improve the reliability of the display device.

Figure 9A:
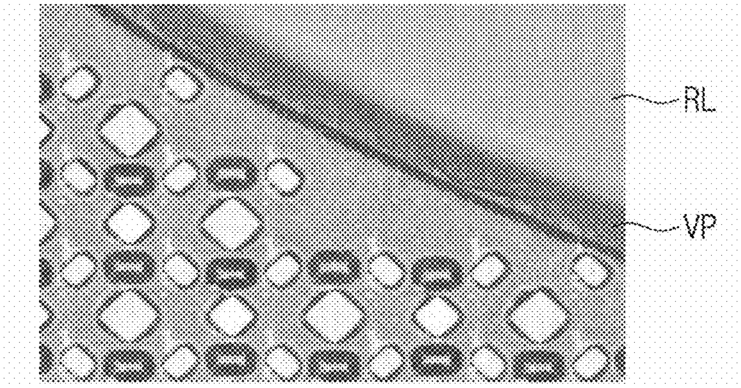
FIG. 9A is a captured image of a portion of an embodiment of a display device according to the invention.
Figure 9B:
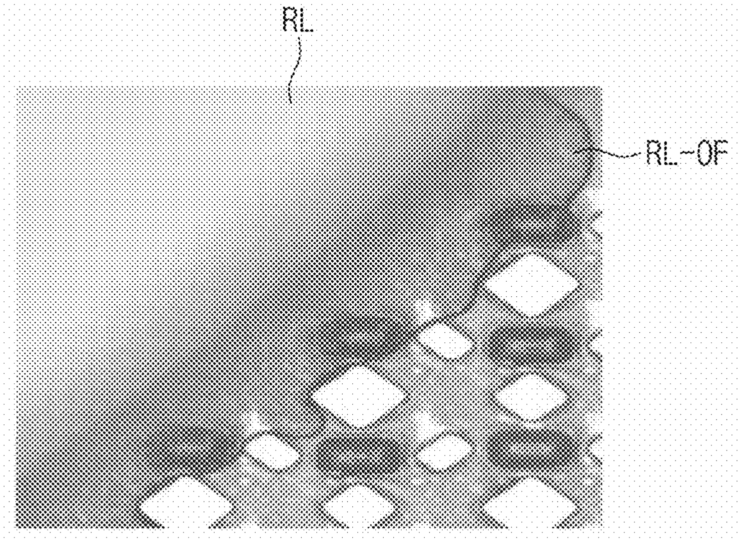
FIG. 9B is a captured image of a portion of a comparative example of a display device.

FIG. 9A is a captured image of an embodiment of a portion of a display device according to the invention. FIG. 9B is a captured image of a comparative example of a portion of a display device.

Referring to FIGS. 9A and 9B, in a display device in an embodiment of the invention, an overflowed fluid may be collected in a valley section VP formed or provided by a first opening of a pixel defining film, thereby preventing the fluid from overflowing into a portion in which a pixel disposed. However, since a valley section formed or provided by a first opening does not exist in a display device of the comparative example, an overflowed portion RL-OF may overflow into a portion in which a pixel is disposed, and consequently, the fluid may be introduced into a light-emitting element to cause a pixel defect. In the display device in an embodiment of the invention, the fluid that forms a light compensation layer may be prevented from overflowing into the pixel, thereby providing the display device in which a pixel defect is prevented.

According to a display device and an electronic device in an embodiment of the invention, a light compensation layer may be provided in a hole by which an electronic module is exposed, so that a function of the electronic module is improved and a fluid is prevented from flowing into a region in which a pixel is disposed during formation of the light compensation layer, thereby preventing occurrence of a pixel defect. Accordingly, the display efficiency and the reliability of the display device and the electronic device may be improved.

Although the embodiments of the invention have been described, it is understood that the invention should not be limited to these embodiments but various changes and modifications may be made by one ordinary skilled in the art within the spirit and scope of the invention as hereinafter claimed. Therefore, the technical scope of the invention is not limited to the contents described in the detailed description of the specification, but should be determined by the claims.

What is claimed is:

1. A display device in which a signal transmission region, a peripheral region surrounding at least a portion of the signal transmission region, and a display region adjacent to the peripheral region are defined, the display device comprising:

a base layer;

a circuit layer disposed on the base layer; and a light-emitting element layer disposed on the circuit layer, the light-emitting element layer including:

a plurality of light-emitting elements disposed in the display region, a pixel defining film in which a plurality of light-emitting openings in which the plurality of light-emitting elements is disposed respectively is defined; and a spacer disposed on the pixel defining film, the spacer including a first spacer disposed between the signal transmission region and an opening region in which a first opening is defined, wherein a hole is defined in the signal transmission region, the hole penetrating at least a portion of each of the circuit layer and the light-emitting element layer, a portion of the pixel defining film is disposed in the peripheral region, and the first opening defined in the peripheral region is defined in the portion, disposed in the peripheral region, of the pixel defining film.

2. The display device of claim 1, wherein the display region comprises light-emitting regions in which the plurality of light-emitting elements is disposed respectively, and non-light-emitting regions adjacent to the light-emitting regions, and the spacer comprises a second spacer disposed in each of the non-light-emitting regions.

3. The display device of claim 1, wherein the peripheral region comprises an intermediate region which is a region between the opening region and the display region, and the spacer is not disposed in the intermediate region.

4. The display device of claim 3, wherein with respect to a predetermined direction extending from a center of the hole to the display region, a width of the intermediate region in the predetermined direction is about 30 micrometers to about 50 micrometers.

5. The display device of claim 1, wherein the first spacer has a closed curve shape surrounding the hole in a plan view.

6. The display device of claim 1, wherein the circuit layer comprises a plurality of insulation layers, and the pixel defining film is disposed directly on an outermost insulation layer among the plurality of insulation layers.

7. The display device of claim 6, wherein a surface of the outermost insulation layer on which the pixel defining film is disposed is exposed by the first opening.

8. The display device of claim 6, further comprising a dam surrounding the hole and disposed on the base layer, wherein the dam includes a first dam in which the plurality of insulation layers, the pixel defining film and the first spacer are stacked.

9. The display device of claim 8, wherein the first dam has a closed curve shape surrounding the hole in a plan view, and the dam further comprises a second dam closer to a center of the hole than the first dam is.

10. The display device of claim 9, wherein the second dam has a smaller height than a height of the first dam.

11. The display device of claim 1, further comprising a light compensation layer overlapping at least the signal transmission region and including a portion disposed on the pixel defining film.

12. The display device of claim 1, wherein each of the plurality of light-emitting elements comprises a first electrode exposed by a light-emitting opening of the plurality of light-emitting openings, a light-emitting layer disposed on the first electrode, and a second electrode disposed on the light-emitting layer.

13. The display device of claim 1, wherein with respect to a predetermined direction extending from a center of the hole to the display region, a width of the first opening in the predetermined direction is about 20 micrometers to about 50 micrometers.

14. The display device of claim 1, wherein the first opening has a closed curve shape surrounding the hole in a plan view.

15. The display device of claim 1, further comprising an encapsulation substrate disposed on the light-emitting element layer.

16. A display device in which a signal transmission region, a peripheral region surrounding at least a portion of the signal transmission region, and a display region adjacent to the peripheral region are defined, the display device comprising:

a plurality of light-emitting elements disposed in the display region;

a pixel defining film in which a plurality of light-emitting openings in which the plurality of light-emitting elements is disposed respectively is defined; and a dam surrounding the signal transmission region and disposed in the peripheral region, the dam comprising: a spacer disposed on the pixel defining film, wherein a hole is defined in the signal transmission region, a portion of the pixel defining film is disposed in the peripheral region, and a first opening defined in the peripheral region and adjacent to the dam is defined in the portion, disposed in the peripheral region, of the pixel defining film, wherein the peripheral region comprises an intermediate region which is a region between the display region and an opening region in which the first opening is defined, and the spacer is not disposed in the intermediate region.

17. An electronic device comprising:

a display device in which a signal transmission region, a peripheral region surrounding at least a portion of the signal transmission region, and a display region adjacent to the peripheral region are defined, the display device comprising;

a base layer;

a circuit layer disposed on the base layer;

a light-emitting element layer disposed on the circuit layer and including:

a plurality of light-emitting elements disposed in the display region;

a pixel defining film in which a plurality of light-emitting openings in which the plurality of light-emitting elements is disposed respectively is defined; and a spacer disposed on the pixel defining film, the spacer including a first spacer disposed between the signal transmission region and an opening region in which a first opening is defined; and an electronic module overlapping the signal transmission region, wherein a hole is defined in the signal transmission region, the hole penetrating at least a portion of each of the circuit layer and the light-emitting element layer, a portion of the pixel defining film is disposed in the peripheral region, and the first opening defined in the peripheral region is defined in the portion, disposed in the peripheral region, of the pixel defining film.

18. The electronic device of claim 17, wherein the circuit layer comprises a plurality of insulation layers, and a surface of an outermost insulation layer among the plurality of insulation layers on which the pixel defining film is disposed is exposed by the first opening.

* * * * *